United States Patent
Gollier et al.

(10) Patent No.: US 7,649,918 B2
(45) Date of Patent: Jan. 19, 2010

(54) MULTI-COMPONENT WAVELENGTH CONVERSION DEVICES AND LASERS INCORPORATING THE SAME

(75) Inventors: Jacques Gollier, Painted Post, NY (US); James Micheal Harris, Elmira, NY (US)

(73) Assignee: Corning Incorporated, Corning, NY (US)

( * ) Notice: Subject to any disclaimer, the term of this patent is extended or adjusted under 35 U.S.C. 154(b) by 22 days.

(21) Appl. No.: 11/978,857

(22) Filed: Oct. 30, 2007

(65) Prior Publication Data
US 2009/0110013 A1    Apr. 30, 2009

(51) Int. Cl.
*H01S 3/10* (2006.01)
*H01S 5/00* (2006.01)

(52) U.S. Cl. .............................. 372/21; 372/22; 372/50.1
(58) Field of Classification Search .................... 372/21, 372/22, 50.1
See application file for complete search history.

(56) References Cited

U.S. PATENT DOCUMENTS

| | | | |
|---|---|---|---|
| 5,436,919 A | 7/1995 | Chwalek et al. | 372/7 |
| 5,559,824 A | 9/1996 | Baird et al. | 372/95 |
| 5,604,634 A | 2/1997 | Khoury et al. | 359/559 |
| 6,522,794 B1 | 2/2003 | Bischel et al. | 385/4 |
| 6,856,737 B1 | 2/2005 | Parker et al. | 385/122 |
| 2006/0039423 A1 | 2/2006 | Tokuhisa et al. | 372/22 |
| 2006/0165137 A1 | 7/2006 | Kachanov et al. | 372/21 |
| 2006/0165138 A1 | 7/2006 | Kachanov et al. | 372/21 |
| 2007/0019691 A1 | 1/2007 | Monch et al. | 372/22 |
| 2007/0092194 A1 | 4/2007 | Smith et al. | 385/132 |
| 2007/0104451 A1 | 5/2007 | Handelman | 385/147 |

FOREIGN PATENT DOCUMENTS

JP    2007-147688    6/2007
WO   WO2005/098528   10/2005

*Primary Examiner*—Armando Rodriguez
(74) *Attorney, Agent, or Firm*—Gregory V. Bean

(57) ABSTRACT

According to one embodiment of the present invention, a frequency-converted laser source is provided wherein the wavelength conversion device comprises a plurality of waveguide components comprising respective input faces positioned in an effective focal field of the laser source. Individual ones of the waveguide components contribute different elements to a set of distinct wavelength conversion properties, defining a set of distinct wavelength conversion properties attributable to the waveguide components. The set of distinct wavelength conversion properties comprises properties representing phase matching wavelengths of the waveguide components, spectral widths of the waveguide components, conversion efficiency of the waveguide components, or combinations thereof. Additional embodiments are disclosed and claimed.

18 Claims, 4 Drawing Sheets

MULTI-COMPONENT WAVELENGTH CONVERSION DEVICES AND LASERS INCORPORATING THE SAME

BACKGROUND OF THE INVENTION

The present invention relates generally to semiconductor lasers, laser controllers, laser projection systems, and other optical systems incorporating semiconductor lasers. More particularly, by way of illustration and not limitation, embodiments of the present invention relate generally to the use of wavelength conversion devices in optical packages, laser projection systems, and other optical systems incorporating semiconductor lasers.

SUMMARY OF THE INVENTION

Short wavelength sources can be configured for high-speed modulation by combining a single-wavelength semiconductor laser, such as a distributed feedback (DFB) laser, a distributed Bragg reflector (DBR) laser, or a Fabry-Perot laser with a wavelength conversion device, such as a second harmonic generation (SHG) crystal. The SHG crystal can be configured to generate higher harmonic waves of the fundamental laser signal by tuning, for example, a 1060 nm DBR or DFB laser to the spectral center of an SHG crystal, which converts the wavelength to 530 nm. However, the wavelength conversion efficiency of an SHG crystal, such as MgO-doped periodically poled lithium niobate (PPLN), is strongly dependent on the wavelength matching between the laser diode and the SHG device. As will be appreciated by those familiar with laser design, SHG crystals use second harmonic generation properties of non-linear crystals to frequency-double laser radiation directed into the crystal. DFB lasers are resonant-cavity lasers using gratings or similar periodic structures etched into the semiconductor material as a reflective medium. DBR lasers are lasers in which the etched grating is physically separated from the electronic pumping area of the semiconductor laser.

The bandwidth of a PPLN SHG device is often very small—for a typical PPLN SHG wavelength conversion device, the full width half maximum (FWHM) wavelength conversion bandwidth is often only in the 0.16 to 0.2 nm range and mostly depends on the length of the crystal. Mode hopping and uncontrolled wavelength variations within the laser cavity due to change of the drive current can cause the output wavelength of a semiconductor laser to move outside of this allowable bandwidth during operation. Once the semiconductor laser wavelength deviates outside the wavelength conversion bandwidth of the PPLN SHG device, the output power of the conversion device at the target wavelength drops drastically. These changes in wavelength can be caused by several factors. For example, the DBR section temperature is affected by the amplitude of the gain-section drive current due to the thermal-crosstalk effect. There are other factors that make the DBR laser wavelength different from the PPLN wavelength, including variation of the ambient temperature and manufacturing tolerance of a DBR laser and a PPLN. In laser projection systems using a light source consisting of a DBR laser and a PPLN, for example, the wavelength fluctuations of the laser often generates some variation over time of the crystal conversion efficiency. This causes some variations of the frequency converted light which results in image defects that can be readily visible as defects at specific locations in the image. These visible defects typically manifest themselves as organized, patterned image defects across the image as well as pseudo random noise in the image. One method for minimizing those image artifacts consists of using crystals with larger spectral band pass. However, increasing the band pass by using shorter crystals, for example, typically decreases the conversion efficiency of the system. It is therefore often impossible to insure both low image noise and high system efficiency in the system.

Given the challenges associated with wavelength matching and stabilization in developing semiconductor lasers, the present inventors have recognized beneficial means to ensure proper alignment of the lasing wavelength with the wavelength conversion peak of the wavelength conversion device. For example, according to one embodiment of the present invention, a frequency-converted laser source is provided wherein the wavelength conversion device comprises a plurality of waveguide components comprising respective input faces positioned in an effective focal field of the coupling optics of the laser source. Individual ones of the waveguide components contribute different elements to a set of distinct wavelength conversion properties, defining a set of distinct wavelength conversion properties attributable to the waveguide components. The set of distinct wavelength conversion properties comprises properties representing phase matching wavelengths of the waveguide components, spectral widths of the waveguide components, conversion efficiency of the waveguide components, or combinations thereof.

In another embodiment, an actuator is used so that one specific waveguide with some specific properties can be selected. Depending on the actuator setting, the instrument can operate in different modes. For instance, when image noise is important and efficiency is of less priority, a wider spectral bandwidth waveguide can be selected. When power and efficiency are the major parameters of interest, then a waveguide having a higher efficiency can be selected.

The frequency converted laser source can be provided with a controller that is programmed to register an optical signal propagating along the optical path of the source with different ones of the waveguide components on a selective basis. For example, according to one embodiment of the present invention, the controller can be programmed to execute a low noise mode, where the spectral bandwidth of a registered waveguide component is relatively broad and defines a relatively low conversion efficiency, and execute a high efficiency mode, where the spectral bandwidth of a registered waveguide component is relatively narrow and defines a relatively high conversion efficiency. In this manner, laser sources and laser projection systems according to the present invention can be utilized in many different applications requiring different modes of operation. For example, when projecting images in a dark environment, it may be desired to optimize the image quality while maximum power or wall plug efficiency is not so crucial. In other situations such as a bright environment, the key parameter may be image brightness and it may be preferable to allow increased image noise to get better a better overall viewing experience.

In other embodiments of the present invention, the waveguide components are configured to define different phase matching wavelengths and the controller is programmed to allow for selection of an optimum phase matching wavelength or to execute a spectral bandwidth broadening mode by registering an optical signal propagating along the optical path with successive ones of the waveguide components. These modes of operation can be used to take advantage of a broader distribution of lasers in manufacturing, relieve some of the design constraints introduced when using tunable DBR lasers to achieve phase matching, or reduce image speckle in laser projection systems.

Still further embodiments of the present invention relate solely to the design of wavelength conversion devices. For example, wavelength conversion devices are provided where the wavelength conversion device is configured as a monolithic structure comprising a plurality of waveguide components. The spectral bandwidth of one of the waveguide components is relatively broad and defines a relatively low conversion efficiency, while the spectral bandwidth of another of the waveguide components is relatively narrow and defines a relatively high conversion efficiency. Alternatively, the phase matching wavelengths of the individual waveguide components may differ.

Although some of the concepts of the present invention are described in the context of semiconductor lasers, it is contemplated that the concepts of the present invention will have utility in a variety of types of lasers, including but not limited to DBR lasers, DFB lasers, Fabry-Perot lasers, and many types of external cavity lasers. In addition, although the concepts of the present invention are described primarily in the context of image forming and laser projection, it is contemplated that various concepts of the present invention may also be applicable to any laser application where alignment of the lasing wavelength with the wavelength conversion peak of the wavelength conversion device is an issue.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
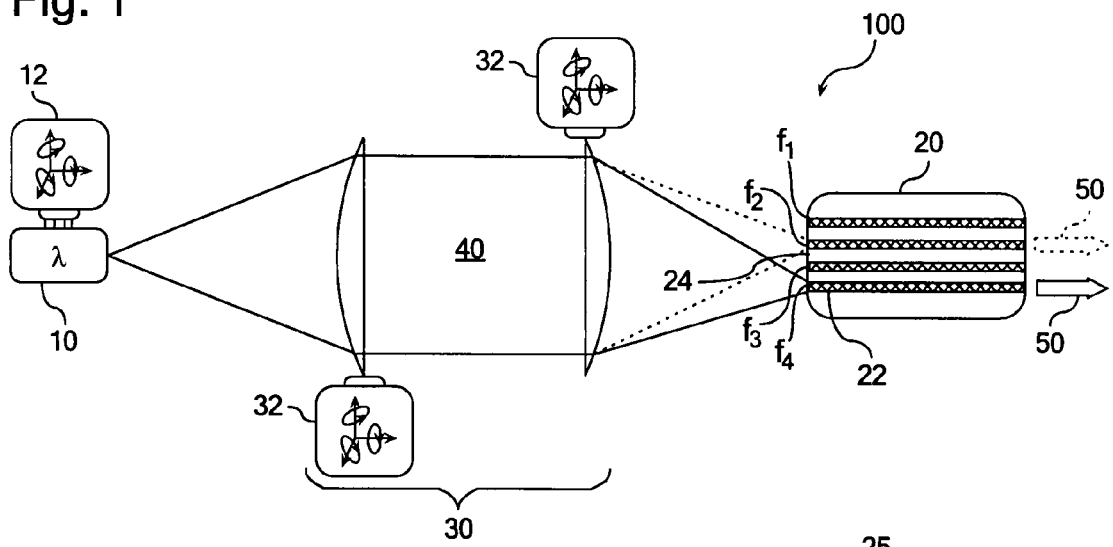
FIGS. 1-4 and 8 are schematic illustrations of semiconductor lasers optically coupled to light wavelength conversion devices.

Referring initially to FIG. 1, a frequency-converted laser source 100 according to one embodiment of the present invention is illustrated. The laser source 100 comprises a laser 10, a wavelength conversion device 20, and coupling optics 30 positioned along an optical path 40 defined between the laser 10 and the wavelength conversion device 30. Typically, the wavelength conversion device 20 is configured as a monolithic PPLN SHG crystal, or other suitable wavelength conversion material. The wavelength conversion device 20 converts the incident light into higher harmonic waves and outputs a wavelength-converted signal 50. This type of configuration is particularly useful in generating shorter wavelength laser beams from longer wavelength semiconductor lasers and can be used, for example, as a visible laser for laser projection systems.

Figure 8:
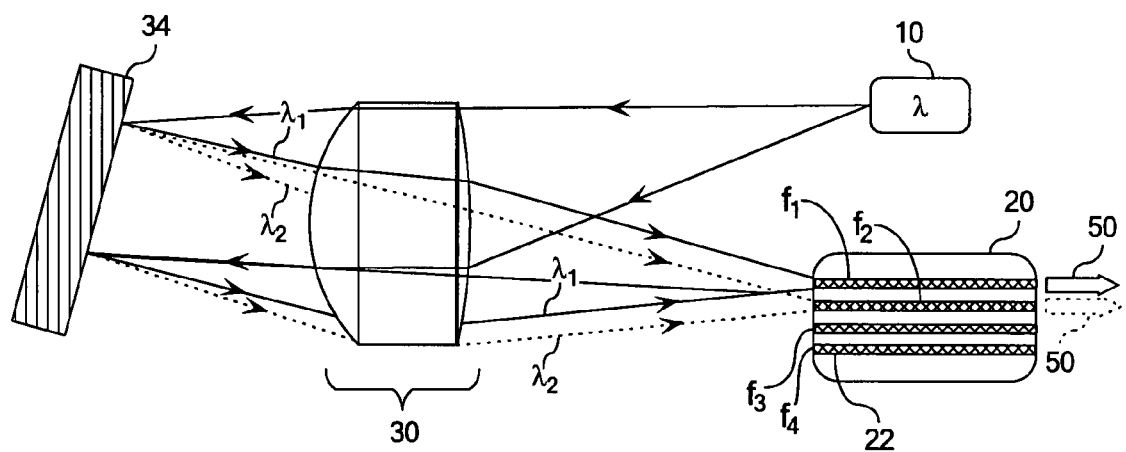

The wavelength conversion device 20 comprises a plurality of waveguide components 22 comprising respective input faces positioned in an effective focal field of the coupling optics 30. For the purposes of describing and defining the present invention, it is noted that an "effective focal field" as utilized herein refers to a set of positions where an optical signal propagating along the optical path 40 can be focused or directed through manipulation of the laser 10, the wavelength conversion device 20, or the coupling optics 30. For example, in FIG. 1, the effective focal field of the coupling optics 30 includes effective focal points $f_1$, $f_2$, $f_3$, $f_4$ that can be addressed by varying the optical properties of the coupling optics 30 using a multi-axis actuator 32 or by incorporating deformable lenses, tilting mirrors, rotating prisms, liquid lens components, or other similar devices in the coupling optics. Similarly, the effective focal points $f_1$, $f_2$, $f_3$, $f_4$ can be addressed by varying the position, orientation, or position and orientation of the laser 10 using a multi-axis actuator 12. Similarly, as is discussed below with reference to FIG. 2, the effective focal points $f_1$, $f_2$, $f_3$, $f_4$ can be addressed by varying the position of the crystal 20 using a multi-axis actuator 25. Alternatively, as is illustrated schematically in FIG. 8, where like structure is illustrated with reference to like reference numerals, another approach may consist of using spectrally dispersive elements such as an optical grating 34 configured to deviate the incident light in different ways as a function of the wavelength of the laser 10. By inserting the optical grating 34, or other suitable spectrally dispersive element, in the optical path, the laser spot can be imaged at different ones of the effective focal points $f_1$, $f_2$, $f_3$, $f_4$ by varying the wavelength $\lambda_1$, $\lambda_2$ of the laser 10.

The individual waveguide components 22 of the wavelength conversion device 20 contribute different elements to a set of distinct wavelength conversion and, as such, collectively define a set of distinct wavelength conversion properties representing parameters including, for example, phase matching wavelengths of the waveguide components 22, spectral widths of the waveguide components 22, conversion efficiency of the waveguide components 22, or combinations thereof. Thus, utilizing the aforementioned actuators 12, 32 or some other conventional or yet to be developed means for varying the optical properties of the coupling optics 30 or the laser 10, a programmable controller can be provided with a user interface, placed in functional communication with elements of the laser source 100, and programmed to register an optical signal propagating along the optical path 40 with different ones of the waveguide components 22 on a selective basis.

Figure 5:
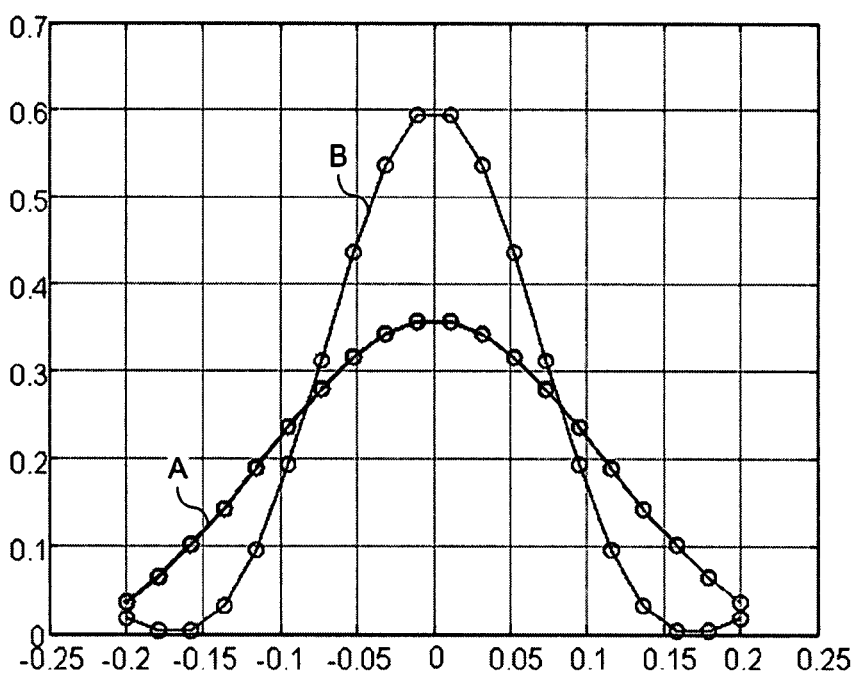
FIG. 5 illustrates the conversion efficiency curves for two selected SHG wavelength conversion devices.

It is contemplated that the set of distinct wavelength conversion properties of the waveguide components 22 can be established in a variety of ways. For example, and not by way of limitation, the PPLN spectral curves of an 8 mm long and a 12 mm long crystal are shown in FIG. 5, as curves A and B respectively. The conversion efficiency of the 12 mm long crystal (see curve B) reaches 60% but the spectral bandwidth FWHM is limited to 0.15 nm. With a shorter crystal like 8 mm (see curve A), the spectral bandwidth increases to 0.24 nm. However, the best conversion efficiency that can be reached is around 35%. A variety of methods for varying the PPLN spectral bandwidth, conversion efficiency, and phase matching wavelength of PPLN crystals are taught in the literature and will continue to be developed. For example, and not by way of limitation, the spectral bandwidth, conversion efficiency, and phase matching wavelength of a PPLN crystal can be varied by chirping the periodic poling of the crystal, configuring the crystal to have several zones with different poling periods, slightly modifying the position of poling at one specific position along the crystal, or by providing different poling structures, ridge geometries, coatings along the different waveguide components 22. As an example, one waveguide can be poled over the entire length of the crystal to provide larger conversion efficiency while the other one can only be poled over a limited section of the waveguide to provide wider spectral bandwidth.

Given the distinct wavelength conversion properties associated with each of the waveguide components 22, the controller can be programmed to execute a variety of operational modes in an automated manner, or as controlled by a user. For example, according to one embodiment of the present invention, the controller can be programmed to respond to user input and execute either (i) a low noise mode, e.g., when registered at $f_4$ in FIG. 1, where the spectral bandwidth of the registered waveguide component 22 is relatively broad and defines a relatively low conversion efficiency or (ii) a high efficiency mode, e.g., when registered at $f_2$ in FIG. 1, where the spectral bandwidth of the registered waveguide component 22 is relatively narrow and defines a relatively high conversion efficiency. These operational modes are illustrated schematically by the frequency conversion curves A and B in FIG. 5.

It is contemplated that additional effective focal points $f1$, $f3$, etc., can be addressed to execute alternative low noise or high efficiency modes, or additional operational modes. For example, according to one embodiment of the present invention, the waveguide components 22 are constructed to define different phase matching wavelengths and the controller is programmed to execute a spectral bandwidth broadening mode by registering an optical signal propagating along the optical path with successive ones of the waveguide components 22. In this manner, where the laser source 100 is configured to generate a scanned laser image comprising a succession of image frames displayed at a given frame rate, the optical signal propagating along the optical path 40 can be registered with successive waveguide components 22 to select a different conversion wavelength for each image frame and, therefore, minimize speckle in the image. Indeed, by selecting a different wavelength at each frame of the images to be displayed, the shape of the speckle will be modified at relatively high frequency, e.g., at 50 or 60 Hz. Accordingly, if the difference in wavelength across the waveguide components 22 is large enough, the speckle contrast can be reduced by a factor of about $\sqrt{2}$.

As will be appreciated by those familiar with DBR laser design and operation, in order to adjust the wavelength of a DBR laser to the exact wavelength that is needed to reach phase matching with an SHG crystal, power must be sent to some of the laser diode sections to adjust or stabilize the lasing wavelength. As an example, the wavelength of a DBR laser can be tuned by sending some current into the DBR section or into a heater thermally coupled to the DBR section. The amount of power that is needed to tune the wavelength may not be negligible and can significantly degrade the wall plug efficiency of the system. By optimizing each waveguide component for conversion of a different wavelength, and providing the capability of choosing between several waveguide components centered at different wavelength the concepts of the aforementioned embodiment of the present invention can be utilized to reduce or eliminate the need for precise wavelength control in the DBR section of a DBR laser and reduce the power needed to tune the laser wavelength. It is also contemplated that the aforementioned embodiment of the present invention can allow for the use of either lower cost lasers (DFB, Fabry-Perot, or other) or lasers that represent a wider range of manufacturing tolerances.

Figure 2:
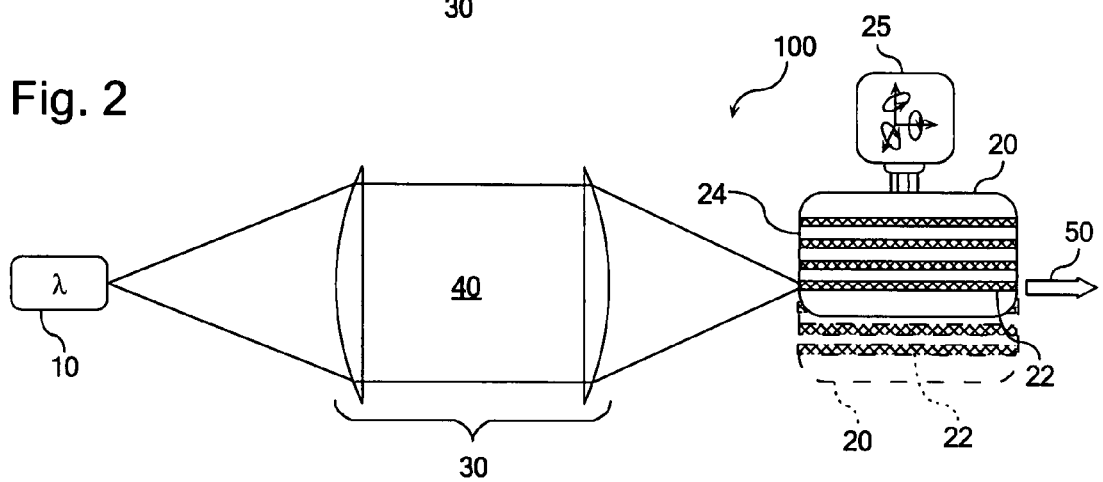
Figure 3:
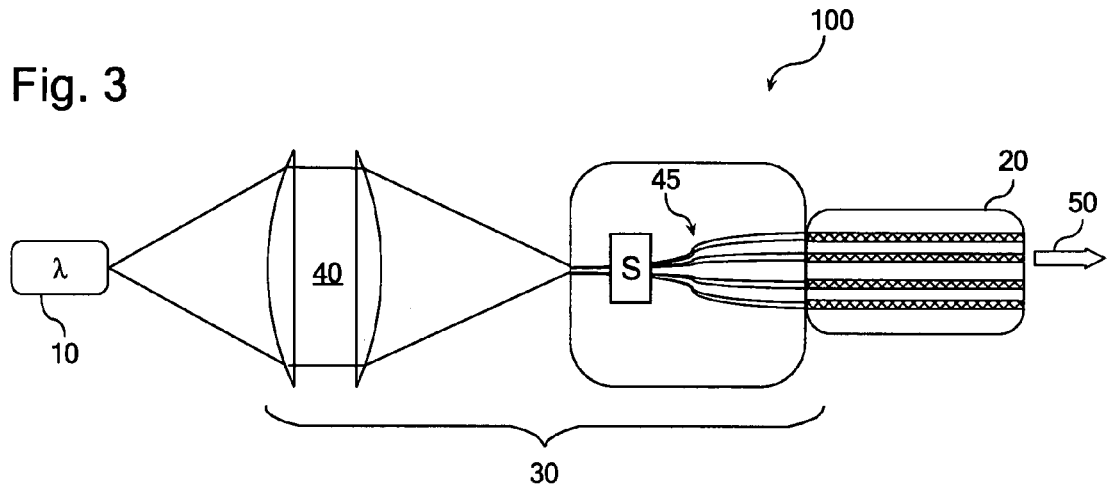

FIGS. 2 and 3 present alternative configurations for enabling the aforementioned selective registration of an optical signal propagating along the optical path 40 with different ones of the waveguide components 22. Specifically, in the embodiment illustrated in FIG. 2, the effective focal field of the coupling optics 30 includes focal points that are addressable by using an multi-axis actuator 25 to vary the position, orientation, or position and orientation of the wavelength conversion device 20. FIG. 3 represents a departure from actuator-based control in that it illustrates the use of a waveguided or non-waveguided optical switch S, such as a 1×n planar optical switch or a 1×n mechanical optical switch, to selectively route an optical signal along different parts of a multi-component portion 45 of the optical path 40.

Figure 6:
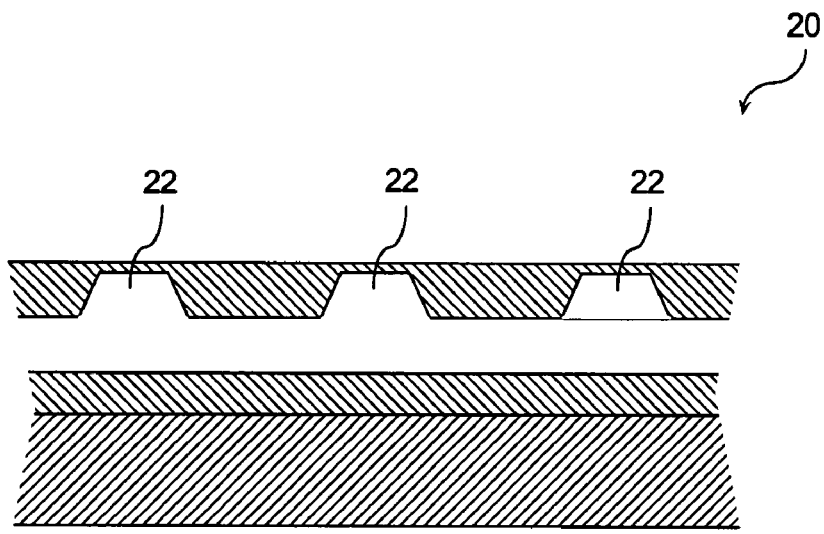
FIGS. 6 and 7 illustrate alternative ways of aligning individual waveguide components along a common input face of a wavelength conversion device.
Figure 7:
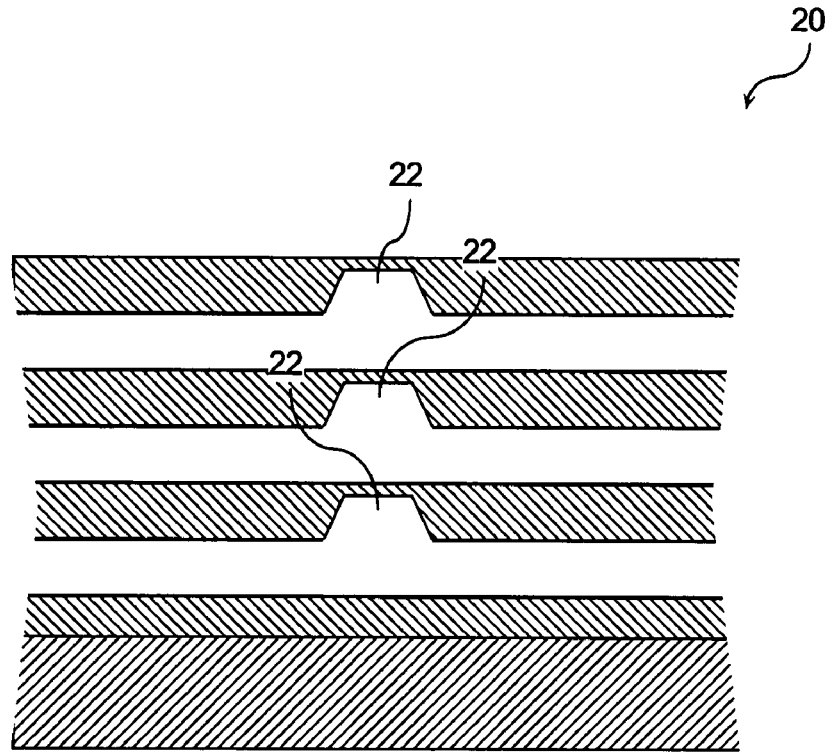

In FIGS. 1-3, the respective input faces of the individual waveguide components 22 of the wavelength conversion device 20 are aligned along a common input face 24 of the wavelength conversion device 20. The preferred spacing between the respective input faces of the individual waveguide components 22 along the common input face 24 will typically be very sensitive to the delta index between the waveguide and the clad. The manufacturing processes utilized to fabricate the wavelength conversion device 20 will also play a role in the spacing. It is contemplated that the respective roles of each of these factors will vary and, as such, it is noted that the preferred spacing should at least be sufficient to maintain a guided wave in the selected waveguide component 22. The individual waveguide components 22 can be aligned along the common input face 24 in a common waveguide layer defined in the wavelength conversion device 20, as is illustrated in FIG. 6, stacked waveguide layers defined in the wavelength conversion device 20, as is illustrated in FIG. 7, or provided in a variety of more complex, two-dimensional configurations by combining the configurations of FIGS. 6 and 7.

Figure 4:
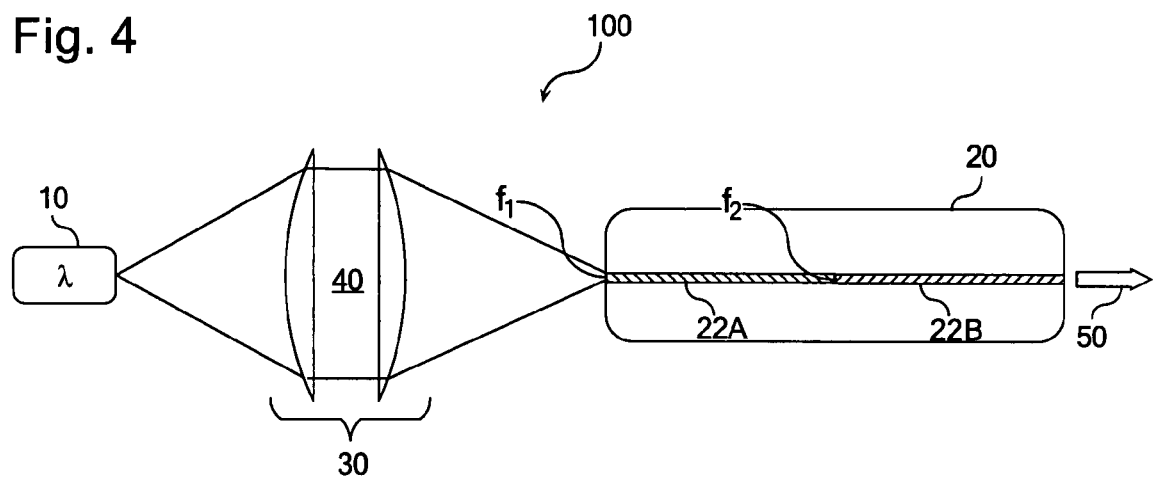

In the embodiment of the present invention illustrated in FIG. 4, the respective input faces of the individual waveguide components 22 of the wavelength conversion device 20 are arranged in succession along a common optical path. The output face of a first individual waveguide component 22A of the wavelength conversion device 20 is optically coupled to the input face of a second individual waveguide component 22B of the wavelength conversion device 20. The optical path 40 defined between the laser and the wavelength conversion device comprises a single component optical path and the effective focal field of the coupling optics 30 extends along the single optical path from an input end of the first waveguide component 22A at $f_1$ to an input end of the second waveguide component 22B at $f_2$. In this manner, when the laser 10 operates at the phase matching wavelength of the first waveguide component 22A, the optical signal will be converted in the first waveguide component 22A. When the converted optical signal reaches the second waveguide component 22B, the converted wavelength of the optical signal will be too far away from the phase matching wavelength of the second waveguide component 22B and the second waveguide component 22B merely functions as a transparent waveguide. When the laser 10 operates at the phase matching wavelength of the second waveguide component 22B, the first waveguide component 22A merely functions as a transparent waveguide and the optical signal is only converted when it reaches the second waveguide component 22B. It is contemplated that the configuration illustrated in FIG. 4 can be combined with an embodiment that also employs a one or two-dimensional array of input faces, as is discussed above with reference to FIGS. 1-3.

A multi-tone image can be generated by image projection systems according to the present invention by configuring the image projection electronics and the corresponding laser drive currents to establish a pixel intensity that varies across an array of image pixels. For example, where the programmable light source is comprised within a pixel-based laser projection system, controllers according to the present invention may be programmed to control the periodic lasing intensity of the semiconductor laser such that the encoded data signal comprises a plurality of encoded data periods corresponding to the frame rate of the projection system.

In configuring laser sources according to the present invention according to FIGS. 1, 2, 3, 6 and 7 for operation in image projection systems, it should be noted that the position of the output signal 50 will depend on which waveguide component 22 has been selected, as is illustrated in FIG. 2. This issue can be addressed by introducing some delay in the image projection data to account for the shift in the output signal 50 and maintain registration with the other colors of the laser projector.

It is contemplated that programmable light sources according to the present invention may comprise a plurality of semiconductor lasers, at least one of which is coupled to the wavelength conversion device and controlled according to one or more of the control procedures contemplated by the present invention. Further detail concerning the configuration of scanning laser image projection systems and the manner in which varying pixel intensities are generated across an image may be gleaned from a variety of readily available teachings on the subject. Although the present invention is clearly applicable to pixel-based projection systems, it is contemplated that other projection systems, such as spatial light modulator based systems (including digital light processing (DLP), transmissive LCD, and liquid crystal on silicon (LCOS)), incorporating laser-based light sources may also benefit from the wavelength control techniques described herein.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents. For example, it is contemplated that the optical signal emitted by the laser 10 can be either directly coupled into the wavelength conversion device 20 or can be coupled through collimating and focusing optics 30 or some other type of suitable optical element or optical system.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the term "approximately" is utilized herein to represent the inherent degree of uncertainty that may be attributed to any quantitative comparison, value, measurement, or other representation.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

For the purposes of defining and describing the present invention, it is noted that one or more of the following claims recites a controller "programmed to" execute one or more recited acts. For the purposes of defining the present invention, it is noted that this phrase is introduced in the claims as an open-ended transitional phrase and should be interpreted in like manner as the more commonly used open-ended preamble term "comprising." In addition, it is noted that recitations herein of a component of the present invention, such as a controller being "programmed" to embody a particular property, function in a particular manner, etc., are structural recitations, as opposed to recitations of intended use. More specifically, the references herein to the manner in which a component is "programmed" denotes an existing physical condition of the component and, as such, is to be taken as a definite recitation of the structural characteristics of the component. In addition, reference herein to a controller that is "programmable" should not be taken to require that the controller be programmable and re-programmable. Rather, all that is required of a "programmable" controller is that it can be fabricated, altered, or somehow configured to perform one or more tasks, issue one or more commands, or generate one or more signals according to a programmed routine.

What is claimed is:

1. A frequency-converted laser source comprising a laser and a wavelength conversion device, wherein:
   the wavelength conversion device comprises a plurality of waveguide components comprising respective input faces positioned in an effective focal field of the laser source;
   individual waveguide components of the wavelength conversion device vary one from another so as to provide a set of distinct wavelength conversion properties such that the waveguide components collectively define a set of distinct wavelength conversion properties;
   the set of distinct wavelength conversion properties comprises properties representing phase matching wavelengths of the waveguide components, spectral widths of the waveguide components, conversion efficiency of the waveguide components, or combinations thereof; and
   the frequency converted laser source is programmed to register an optical signal propagating along the optical path with different ones of the waveguide components on a selective basis.

2. A frequency-converted laser source as claimed in claim 1 wherein the frequency-converted laser source is programmed to execute, on a selective basis:
   a low noise mode, where the spectral bandwidth of a registered waveguide component is relatively broad and defines a relatively low conversion efficiency; and
   a high efficiency mode, where the spectral bandwidth of a registered waveguide component is relatively narrow and defines a relatively high conversion efficiency.

3. A frequency-converted laser source as claimed in claim 1 wherein:
   the waveguide components define different phase matching wavelengths; and
   the frequency-converted laser source is programmed to execute a spectral bandwidth broadening mode by registering an optical signal propagating along the optical path with successive ones of the waveguide components.

4. A frequency-converted laser source as claimed in claim 3 wherein the laser source is further programmed to operate in the spectral bandwidth broadening mode by generating a scanned laser image comprising a succession of image frames displayed at a given frame rate and registering the optical signal propagating along the optical path with a different one of the waveguide components at a wavelength selection rate that is approximately equal to the frame rate.

5. A frequency-converted laser source as claimed in claim 1 wherein the respective input faces of the individual waveguide components of the wavelength conversion device are arranged in succession along a common optical path of the wavelength conversion device.

6. A frequency-converted laser source as claimed in claim 1 wherein the respective input faces of the individual waveguide components of the wavelength conversion device are aligned along a common input face of the wavelength conversion device in a common waveguide layer defined in the wavelength conversion device.

7. A frequency-converted laser source as claimed in claim 1 wherein the respective input faces of the individual waveguide components of the wavelength conversion device are aligned along a common input face of the wavelength conversion device in stacked waveguide layers defined in the wavelength conversion device.

8. A frequency-converted laser source as claimed in claim 1 wherein the respective input faces of the individual waveguide components of the wavelength conversion device are configured as a two-dimensional array by aligning the waveguide components along a common input face of the wavelength conversion device in a common waveguide layer defined in the wavelength conversion device and in stacked waveguide layers defined in the wavelength conversion device.

9. A frequency-converted laser source as claimed in claim 1 wherein:
the respective input faces of the individual waveguide components of the wavelength conversion device are configured along a common input face of the wavelength conversion device as a one or two-dimensional array and further respective input faces of the individual waveguide components of the wavelength conversion device are arranged in succession along a common optical path of the wavelength conversion device.

10. A frequency-converted laser source as claimed in claim 1 wherein:
the laser source further comprises variable coupling optics positioned along an optical path defined between the laser and the wavelength conversion device;
the effective focal field of the laser source is defined at least in part by the variable coupling optics; and
the laser source is programmed to register the optical signal with different ones of the waveguide components by varying the optical properties of the variable coupling optics to address different effective focal points in the effective focal field of the coupling optics.

11. A frequency-converted laser source as claimed in claim 1 wherein:
the laser source further comprises coupling optics positioned along an optical path defined between the laser and the wavelength conversion device and a laser actuator;
the effective focal field of the laser source is defined at least in part by the laser actuator and the coupling optics; and
the laser source is programmed to register the optical signal with different ones of the waveguide components by varying the position, orientation, or position and orientation of the laser with the laser actuator to address different effective focal points in the effective focal field of the coupling optics.

12. A frequency-converted laser source as claimed in claim 1 wherein:
the laser source further comprises coupling optics positioned along an optical path defined between the laser and the wavelength conversion device a wavelength-tunable laser; and
the coupling optics comprises one or more spectrally dispersive elements configured to deviate incident light in different ways as a function of the wavelength of the incident light; and
the effective focal field of the laser source is defined at least in part by the coupling optics and the wavelength-tunable laser; and
the laser source is programmed to register the optical signal with different ones of the waveguide components by varying the wavelength of the wavelength-tunable laser to address different effective focal points in the effective focal field of the coupling optics.

13. A frequency-converted laser source as claimed in claim 1 wherein:
the laser source further comprises coupling optics positioned along an optical path defined between the laser and the wavelength conversion device and a wavelength conversion device actuator; and
the effective focal field of the laser source is defined at least in part by the coupling optics and the wavelength conversion device actuator; and
the laser source is programmed to register the optical signal with different ones of the waveguide components by varying the position, orientation, or position and orientation of the wavelength conversion device with the conversion device actuator to address different effective focal points in the effective focal field of the coupling optics.

14. A frequency-converted laser source as claimed in claim 13 wherein the wavelength conversion device actuator is configured to vary the position, orientation, or position and orientation of the wavelength conversion device.

15. A frequency-converted laser source as claimed in claim 1 wherein:
the laser source further comprises coupling optics positioned along an optical path defined between the laser and the wavelength conversion device;
the optical path defined between the laser and the wavelength conversion device comprises a multi-component optical path and an optical switch; and
the effective focal field of laser source is defined at least in part by the coupling optics and the optical switch and comprises focal points that are addressable by selectively routing an optical signal along different parts of the multi-component optical path using the optical switch.

16. A frequency-converted laser source as claimed in claim 1 wherein:
the laser source further comprises variable coupling optics positioned along an optical path defined between the laser and the wavelength conversion device;
the optical path defined between the laser and the wavelength conversion device comprises a single component optical path; and
the effective focal field of the laser source is defined at least in part by the variable coupling optics and extends along the single optical path from an input end of one waveguide component along the optical path to an input end of another waveguide component along the optical path.

17. A frequency-converted laser source comprising a laser, a wavelength conversion device, and coupling optics positioned along an optical path defined between the laser and the wavelength conversion device, wherein:

the wavelength conversion device comprises an SHG crystal that is configured as a monolithic structure and comprises a plurality of waveguide components comprising respective input faces positioned in an effective focal field of the coupling optics;

the effective focal field of the coupling optics includes effective focal points that are addressable by varying the optical properties of the coupling optics or the position, orientation, or position and orientation of the laser;

the respective input faces of the individual waveguide components of the wavelength conversion device are aligned along a common input face of the wavelength conversion device;

individual waveguide components of the wavelength conversion device collectively define a set of distinct spectral bandwidths;

the frequency converted laser source is programmed to register an optical signal propagating along the optical path with different ones of the waveguide components to execute a low noise mode and a high efficiency mode on a selective basis;

the spectral bandwidth of a registered waveguide component has a first breadth and defines a first conversion efficiency in the low noise mode; and the spectral bandwidth of a registered waveguide component has a second breadth and defines a second conversion efficiency in the high efficiency mode, the first breadth being broader than the second breadth and the first conversion efficiency being lower than the second conversion efficiency.

18. A wavelength conversion device, wherein:

the wavelength conversion device is configured as a monolithic structure comprising a plurality of waveguide components;

the spectral bandwidth of one of the waveguide components has a first breadth and defines a first conversion efficiency; and the spectral bandwidth of another of the waveguide components has a second breadth and defines a second conversion efficiency, the first breadth being broader than the second breadth and the first conversion efficiency being lower than the second conversion efficiency.

* * * * *